(12) United States Patent
Hsu

(10) Patent No.: US 7,164,300 B2
(45) Date of Patent: Jan. 16, 2007

(54) POWER-LOW RESET CIRCUIT

(75) Inventor: Po-Chin Hsu, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 0 days.

(21) Appl. No.: 11/161,257

(22) Filed: Jul. 28, 2005

(65) Prior Publication Data

US 2006/0109036 A1    May 25, 2006

(30) Foreign Application Priority Data

Nov. 25, 2004   (TW) .............................. 93136265 A

(51) Int. Cl.
*H03K 3/02* (2006.01)
*H03L 7/00* (2006.01)

(52) U.S. Cl. ...................... 327/198; 327/143
(58) Field of Classification Search ................ 327/143, 327/198
See application file for complete search history.

(56) References Cited

U.S. PATENT DOCUMENTS

| | | | | |
|---|---|---|---|---|
| 5,386,152 A | | 1/1995 | Naraki | 327/143 |
| 5,696,461 A | * | 12/1997 | Germini | 327/143 |
| 6,005,423 A | * | 12/1999 | Schultz | 327/143 |
| 6,388,479 B1 | | 5/2002 | Gupta et al. | 327/143 |
| 6,509,768 B1 | * | 1/2003 | Polizzi et al. | 327/143 |
| 6,573,543 B1 | * | 6/2003 | Takata | 257/295 |
| 7,019,417 B1 | * | 3/2006 | Kang | 307/113 |
| 7,081,779 B1 | * | 7/2006 | Kang | 327/143 |
| 2001/0028263 A1 | | 10/2001 | Ohbayashi et al. | 327/143 |
| 2005/0258880 A1 | * | 11/2005 | Jung | 327/143 |
| 2005/0270077 A1 | * | 12/2005 | Kwon | 327/143 |

* cited by examiner

*Primary Examiner*—Long Nguyen
*Assistant Examiner*—Rey Aranda
(74) *Attorney, Agent, or Firm*—Liang Chyun IP Office

(57) ABSTRACT

A power-low reset circuit is provided. The power-low reset circuit receives a reset signal outputted from a power on reset circuit and a stored voltage of a capacitive device in the power-on reset circuit provides an electrical path when a power voltage drops under a predetermined voltage level. The power-on reset circuit is used for generating the reset signal at an initial moment of turning on a power source. The capacitive device can be discharged or charged through the electrical path to restore to its initial status.

7 Claims, 7 Drawing Sheets

POWER-LOW RESET CIRCUIT

CROSS-REFERENCE TO RELATED APPLICATION

This application claims the priority benefit of Taiwan application serial no. 93136265, filed on Nov. 25, 2004. All disclosure of the Taiwan application is incorporated herein by reference.

BACKGROUND OF THE INVENTION

1. Field of the Invention

The present invention generally relates to a reset signal generating circuit, in particular, to a power-low reset circuit.

2. Description of Related Art

In designing an electronic circuit, a reset mechanism is usually added in the electronic circuit to restore it to an initial status when needed. Especially, every component is under an uncertain status at an initial moment of turning on a power source so that it is necessary to reset the circuit, thus restoring every component in the circuit to its initial status.

Accordingly, a circuit for generating a reset signal is required to reset all components in the circuit to the initial status. FIG. 1A is a conventional power-on reset circuit. Referring to FIG. 1A, stored charges on a capacitor 112 will discharge via a resistance 111 before the power source is started to turn on, hence, the N-type transistor 114 will be at a cut-off status when the power source is started to turn on so that the power-on reset circuit in FIG. 1A may generate a reset signal with a high electrical potential by passing a current through the resistance 113 and the buffer 115. Next, by passing a current through a resistance 110, the capacitor 112 is charged to a voltage level exceeding a threshold voltage of the transistor 114. The electrical potentials of the capacitor 112 and the transistor 114 are the same because they are connected in parallel, thus reversing the transistor 114 to an "on" status. Therefore, the transistor 114 will disable the reset signal (RST).

The laid-open U.S. publication No. 2001/0028263 A1 filed on Oct. 11th, 2001, entitled "Power on reset circuit", discloses a power-on reset circuit shown in FIG. 1B. In the power-on reset circuit, a current passing through a transistor 121 is shunted to the capacitor 123 and the transistor 122, thereby lengthening the charging time of the capacitor 123. Eventually, a charged electrical potential of the capacitor 123 allow an inverter 124 to be reversed and thus generating a power-on reset effect. However, a current passing through the transistor 122 must be precisely controlled because the current is too small to keep the reset signal for a sufficient time and is too large to charge the capacitor to a voltage level required to reverse the inverter 124. Besides, a process for charging and discharging the capacitor will consume more current.

FIG. 1C shows a power-on reset circuit disclosed in U.S. Pat. No. 6,388,479, entitled "Oscillator based power-on-reset circuit," (filed on Mar. 22, 2000 and granted on May 14, 2002). Referring to FIG. 1C, in a power-on-reset circuit 130, the clock signal outputted from an oscillator 131 directly passes through the low-pass filter of the transistor 132 and the capacitor 133 to affect an electrical potential stored in the capacitor 133. The power-on-reset effect can be generated after the electrical potential of the capacitor 133 exceeds the threshold point for reversing an inverter 134's status. However, the RC time constant of the conducting resistance of the transistor 132 and the capacitor 133 is required to be larger than the pulse-width of the clock signal of the oscillator 131, otherwise, the power-on-reset circuit can not achieve the reset action. Moreover, the reset signal outputted from the power-on-reset circuit 130 will oscillate.

FIG. 1D shows a power-on reset circuit disclosed in U.S. Pat. No. 5,386,152, entitled "Power-on-reset circuit responsive to a clock signal," (filed on Mar. 17, 1993 and granted on Jan. 31, 1995). Referring to FIG. 1D, in the power-on reset circuit 140, since the charge/discharge signal is acquired by employing a positive source and a negative source of a clock amplifier to trigger a differentiator circuit, a diode protection circuit is needed to prevent an over large reverse signal from reversely entering the circuit via a ground line. Therefore, such a circuit easily induces an unnecessary interfering signal and also generates a signal with a voltage lower than the ground voltage. Moreover, the reset signal outputted from the power-on-reset circuit 130 will oscillate.

However, when a power source voltage VDD drops for some reasons (not while turning off the power source), an unpredictable status of a system will occur due to an over low voltage. After the power source voltage VDD is restored to a normal operating voltage, the system can not normally operate because of its internal confused signals. Accordingly, it is necessarily that the power-on reset circuit sends a reset signal for resetting the system to a start status at an appropriate time after the power source voltage VDD is restored to the normal operating voltage from a dropped voltage. Most prior arts described above can not re-send the reset signal after the power source voltage VDD is dropped and then restored to the normal operating voltage.

SUMMARY OF THE INVENTION

Accordingly, the present invention is directed to a power-low reset circuit capable of providing an electrical path through which a capacitor in the power-on reset circuit will proceed with charging/discharging to restore to its initial status when a power source voltage drops under a predetermined level, the power-low reset circuit will provide an electrical path, Thus, the power-low reset circuit is capable of sending a reset signal for resetting the system to a start status at an appropriate time after the power source voltage VDD is restored to the normal operating voltage.

The present invention is also directed to a power-low reset circuit capable of providing an electrical path through which a capacitor in the power-on reset circuit will proceed with charging/discharging to restore to its initial status in response to a reset signal received from a power-on reset circuit and a stored voltage of a capacitor in the power-on reset circuit when a power source voltage drops under a predetermined level. The power-on reset circuit is used to generate a reset signal at an initial moment of turning on a power source. According to an embodiment of the present invention, the power-low reset circuit comprises a first transistor, a second transistor, a control switch and a clamping circuit. The gate electrode of the first transistor receives the reset signal while the first source/drain thereof receives the stored voltage. The gate electrode of the second transistor receives a power source voltage while the first source/drain thereof is coupled to the second source/drain of the first transistor. The second source/drain of the second transistor is a control voltage. A first connection terminal of the control switch receives the stored voltage while a second connection terminal thereof is coupled to a fixed voltage so that the control switch can determine whether or not the first terminal and the second connection terminal are coupled together in accordance with the control voltage. A first terminal of the clamping circuit is coupled to the second source/drain of the second transistor while a second terminal thereof is coupled to the fixed voltage.

The power-low reset circuit described above according to the present invention further comprises a buffer. The buffer is coupled between the second source/drain of the second transistor and the control switch, and receives the control voltage and outputs the control voltage to the control switch.

According to an embodiment of the present invention, the control switch is adapted for providing an electrical path through which a capacitor in the power-on reset circuit will proceed with charging/discharging to restore to its initial status when a power source voltage drops under a predetermined level, thereby allowing the power-on reset circuit to send a reset signal for resetting the system to a start status at an appropriate time after the power source voltage VDD is restored to the normal operating voltage.

The objectives, other features and advantages of the invention will become more apparent and easily understood from the following detailed description of the invention when taken in conjunction with the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
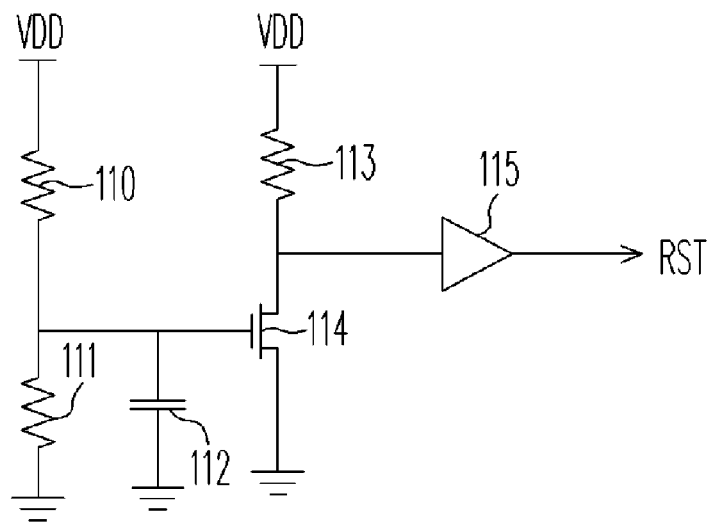
FIG. 1A is a conventional power-on reset circuit.
Figure 1B:
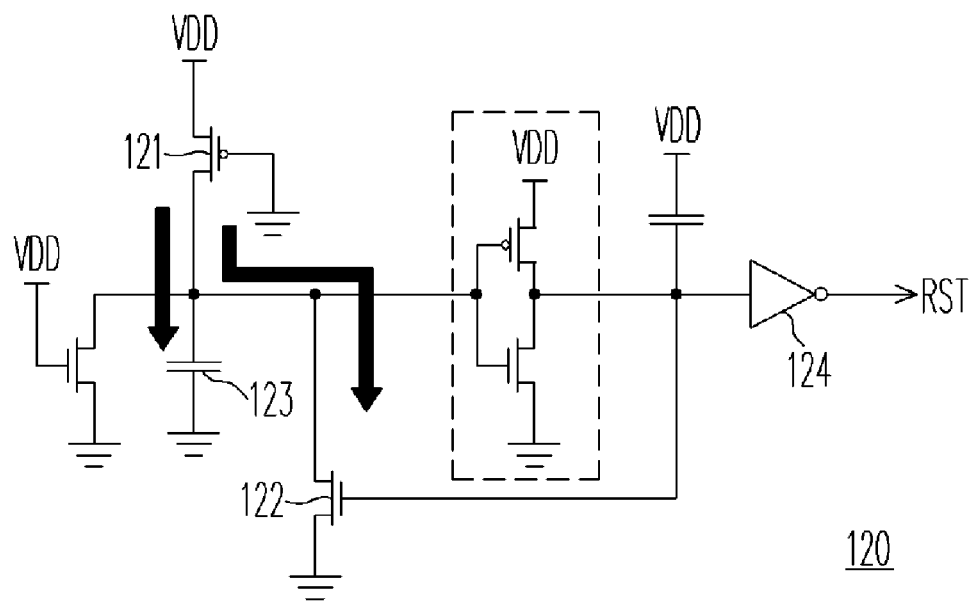
FIG. 1B is a power-on reset circuit disclosed in the U.S. application No. 2001/0,028,263.
Figure 1C:
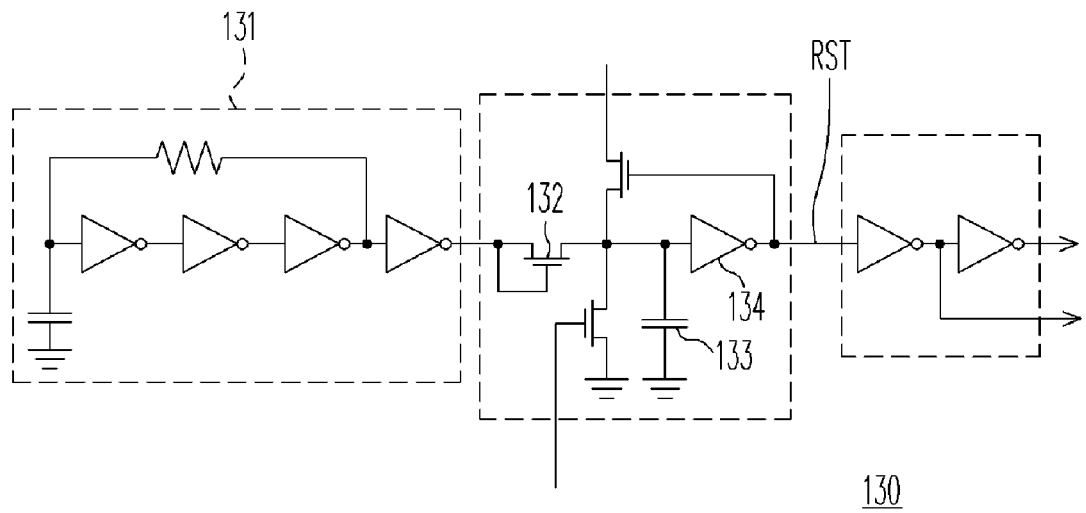
FIG. 1C is a power-on reset circuit disclosed in the U.S. Pat. No. 6,388,479, entitled "Oscillator based on reset circuit responsive to a clock signal."
Figure 1D:
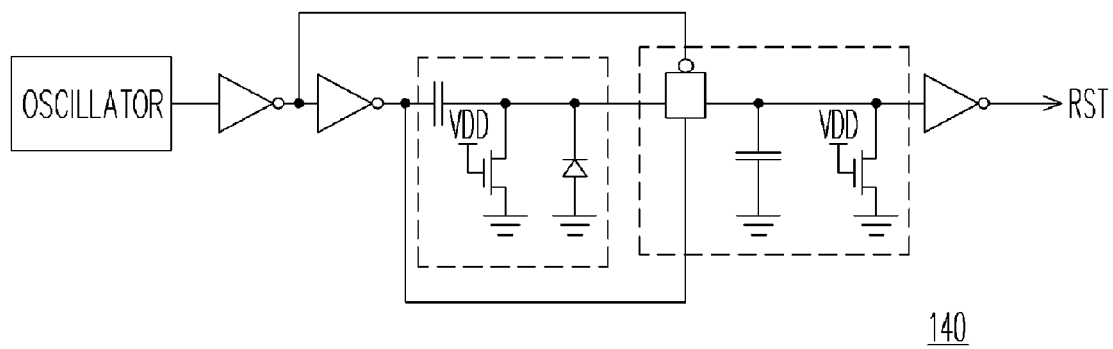
FIG. 1D is a power-on reset circuit disclosed in the U.S. Pat. No. 5,386,152, entitled "Power-on reset circuit responsive to a clock signal."

Reference will now be made in detail to the present preferred embodiments of the invention, examples of which are illustrated in the accompanying drawings. Wherever possible, the same reference numbers are used in the drawings and the description to refer to the same or like parts.

A common power-on reset circuit contains a capacitive device, which is charged by operating a power-on reset circuit from an initial status of a low voltage to a high voltage. However, it is possible to design the power-on reset circuit to discharge the capacitive device from an initial status of the high voltage to the low voltage and achieve a purpose of delaying the reset signal by utilizing the time required for charging/discharging the capacitive device.

However, when a power source voltage VDD drops for some reason (not while turning off the power source), an unpredictable status usually occurs in a system due to an over low voltage. After the power source voltage VDD is restored to a normal operating voltage, the system can not normally operate because of its internal confused signals. Therefore, it is necessary that the power-on reset circuit send a reset signal for resetting the system to a start status at an appropriate time after the power source voltage VDD is restored to the normal operating voltage from the dropped voltage.

Figure 2:
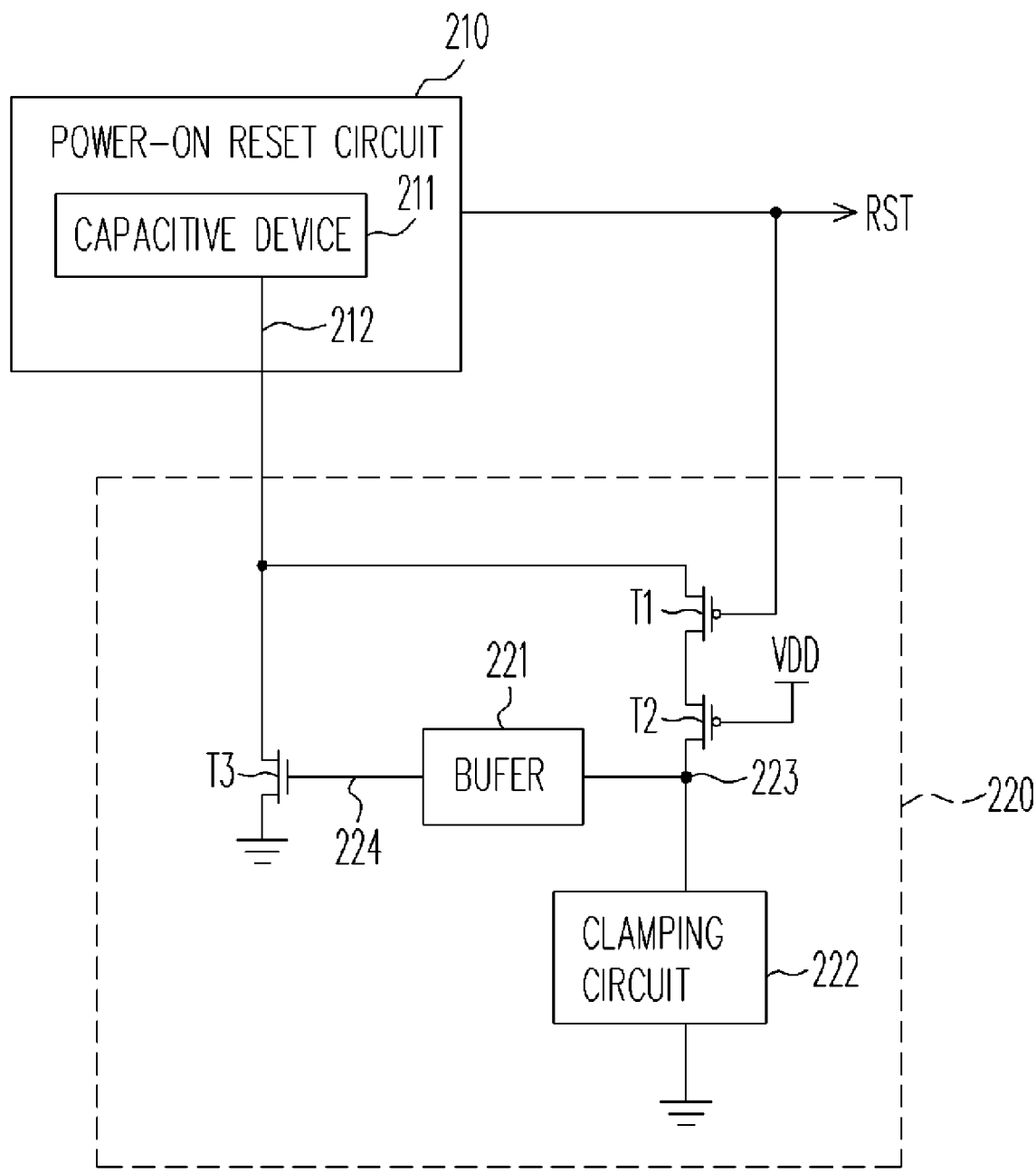
FIG. 2 shows a block diagram of a RST signal generating circuit according to an embodiment of the present invention.

FIG. 2 shows a block diagram of a RST signal generating circuit according to an embodiment of the present invention. The RST signal generating circuit comprises a power-on reset circuit 220 and a power-on reset circuit 210 including a capacitive device 211. Referring to FIG. 2, the power-on reset circuit 210 in the drawing may comprise a variety of power-on reset circuits with an internal capacitive device 211. The power-on reset circuit 210 is used to output a reset signal (RST) at an initial moment of turning on the power source.

As shown in FIG. 2, the power-low reset circuit 220 connected to the capacitive device 211 of the power-on reset circuit 210 receives the reset signal (RST) outputted from the power-on reset circuit 210 and a stored voltage 212 of the capacitive device 211 in the power-on reset circuit 210. In the embodiment, the power-low reset circuit 220 comprises p-type transistors T1 and T2, a buffer 221, a control switch T3 and a clamping circuit 222. The gate electrode of the transistor T1 receives the reset signal while the source thereof receives the stored voltage. The gate electrode of the transistor T2 receives the power source voltage VDD while the source thereof is coupled to the drain of the transistor T1. A drain voltage of the transistor T2 is a control voltage 223.

The buffer 221 receives the control voltage 223 and outputs a control voltage 224 to the control switch T3. A first connection terminal of the control switch T3 receives the stored voltage 212 while a second connection terminal thereof is connected to ground so that the control switch T3 can determine whether or not the first connection terminal and the second connection terminal are connected together in accordance with the control voltage 224. A first terminal of the clamping circuit 222 is coupled to the drain of the transistor T2 while a second terminal thereof is connected to ground. It is assumed that the reset signal (RST) is high at an initial moment of turning on the power source and thus the transistor T1 is at a cut-off status.

As the capacitive device 211 is charged, the status of reset signal (RST) is reversed to a "low" status after the stored voltage reaches a threshold voltage level, which cause the transistor T1 to keep an "on" status during a normal operating period (the power source voltage is within a range of normal operating voltages). Meanwhile, the transistor T2 is at a cut-off status because it is being controlled by the power source voltage VDD, and thus voltage levels of an input signal 223 and an output signal 224 of the buffer 221 are at the "low" status, which cause the transistor T3 to be an open circuit. After the power source voltage VDD drops to under a predetermined level, the transistor T2 is turned on (while the transistor T1 is also turned on) so that voltage levels of the input signal 223 and the output signal 224 of the buffer 221 are reversed to a "high" status, thereby turning on the control switch T3.

By turning on the control switch T3, the power-low reset circuit 220 can provide an electrical path through which the capacitive device 211 proceeds with discharging to be restored to its initial status. Therefore, the power-on reset circuit can again send the reset signal (RST) for resetting the system to a start status at an appropriate time after the power source voltage VDD is restored to the normal operating voltage from the dropped voltage. In the embodiment, the control switch T3 may be an N-type transistor.

However, if the power-on reset circuit 210 is designed to discharge the capacitive device 211 from the initial status of the high voltage to the low voltage and thus achieve the purpose of delaying the reset signal, those skilled in the art would appreciate that by replacing the control switch T3 with a P-type transistor same function can be achieved (coupling the second connection terminal of the control switch T3 to the power source voltage VDD). Therefore, employing a turn-on of the control switch T3 will provide an electrical path through which the capacitive device 211 discharges to be restored to its initial status. Therefore, the above modification is also within the scope of the present invention.

Figure 3:
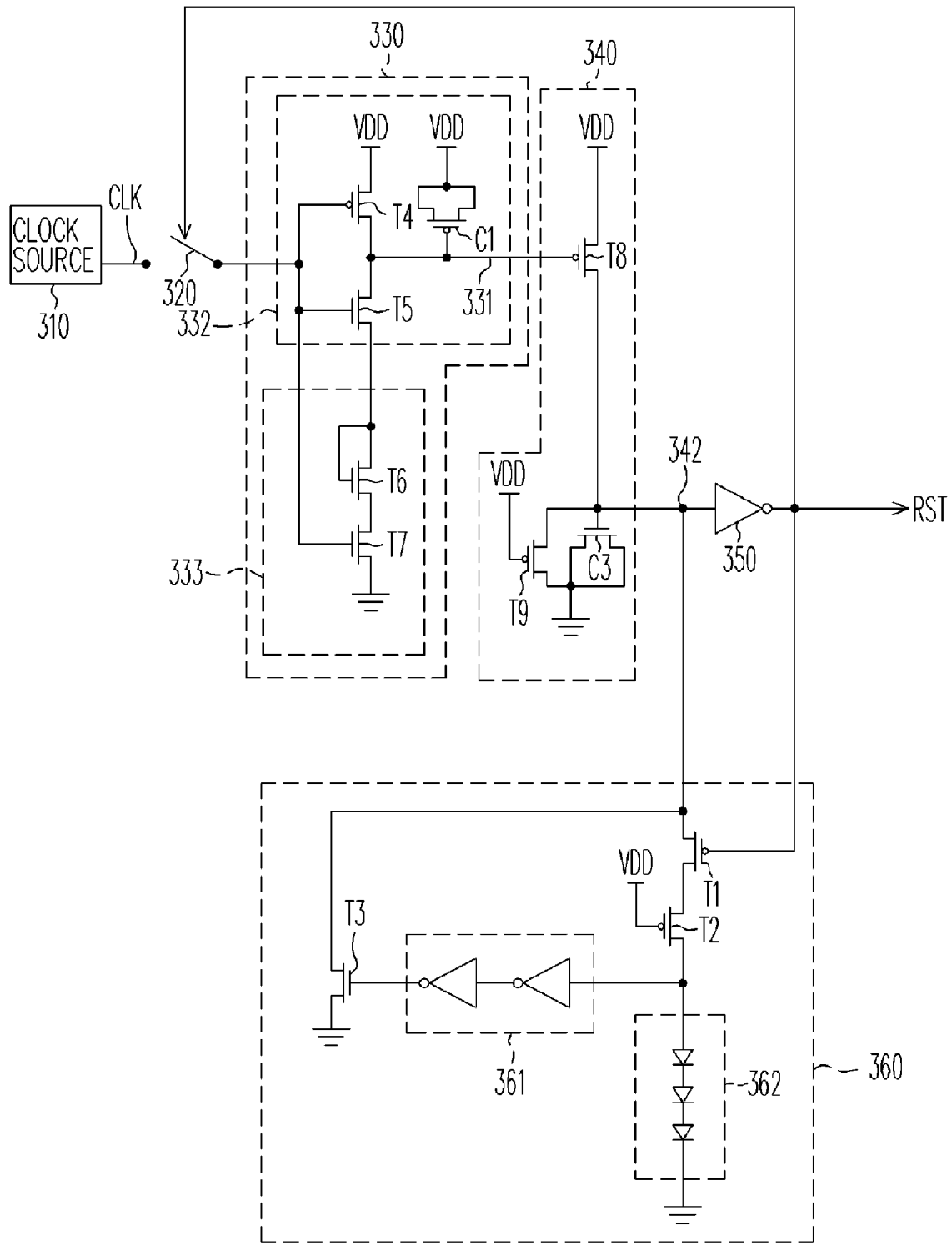
FIG. 3 shows a RST signal generating circuit according to an embodiment of the present invention.

To describe the present invention in more retail, the circuit of the preferred embodiment will be described in more detail as follows. FIG. 3 shows a RST signal generating circuit of an embodiment of the present invention. The RST signal generating circuit comprises a clock signal (CLK) source 310, a control switch 320, a adjusting circuit 330, a charging/discharging unit 340, a power-low reset circuit 360 and an output circuit 350. Referring to FIG. 3, the clock source 310 is used to generate a CLK signal. The control switch T3 comprises a first connection terminal, a second connection terminal and a control terminal, and determines whether or not the clock signal (CLK) received by the first connection terminal is transmitted to the second connection terminal and then outputted to the adjusting circuit 330 in accordance with the reset signal (RST) received by the control terminal. It is assumed that the initial status of the control switch T3 (i.e. a status at the initial moment of turning on the power source) is at an "on" status.

The adjusting circuit 330 receives and adjusts the clock signal (CLK) to output the control signal 331. In the present embodiment, a signal-adjustment comprises limiting an amplitude and a width of the clock signal (CLK), wherein an amount of the limited amplitude is correlated to a turn-on voltage for controlling the charging/discharging, for example, a minimal voltage level of the control signal 331 is limited to be higher than the predetermined voltage level by using the clamping circuit 333 in the adjusting circuit 330. A width-limiting process will shape the amplitude-limited clock signal (CLK) to a control signal 331 having a shorter required time for turning on the charging/discharging path. For example, the clock signal (CLK) received by a wave-shaping circuit 332 in the adjusting circuit 330 can be shaped to a control signal 331 with a smaller duty cycle.

In the embodiment, the clamping circuit 333 comprises an N-type transistor T6 and an N-type transistor T7. The gate electrode of the transistor T6 is coupled to the wave-shaping circuit 332. The drain of the transistor T7 is coupled to the source of the transistor T6 while the drain of the transistor T7 is coupled to a ground voltage and the gate electrode thereof receives the clock signal (CLK).

The wave-shaping circuit 332 comprises a P-type transistor T4, an N-type transistor T5 and a capacitor C1. The gate electrode of the transistor T4 receives the clock signal (CLK) while the source thereof is coupled to the power source voltage VDD and the drain thereof outputs the control signal 331. The gate electrode of the transistor T5 receives the clock signal (CLK) while the drain thereof is coupled to the drain of the transistor T4 and the source of the transistor T5 is coupled to the clamping circuit 333.

The capacitor C1 may be a P-type transistor so as to be integrated into an integrated circuit. Namely, the source and the drain of the transistor are connected to be used as one terminal of a capacitor while the gate electrode is regarded as another terminal. One terminal of the capacitor C1 is coupled to the power source voltage VDD while another terminal is coupled to the drain of the transistor T4.

The charging/discharging unit 340 comprises a capacitive device (for example, a capacitor C3). The charging/discharging unit 340 receives the control signal 331, determines whether or not the charging/discharging the capacitive device is being conducted in accordance with the control signal 331 and then outputs the stored voltage of the capacitive device. In the embodiment, the charging/discharging unit 340 comprises a P-type transistor and the capacitor C3. As described above, the control signal 331 outputted from the adjusting circuit 330 is a pulse signal with a smaller duty cycle, which is received by the gate electrode of the transistor T8. The transistor T8 intermittently turns on the charging path of the capacitor C3 in accordance with the pulse signal, which cause a larger time constant RC to be obtained. Hence, a sufficiently large time constant RC can be obtained by use of a less resistance value and smaller capacitor occupying smaller space.

In the present embodiment, the capacitor C3 of the charging/discharging unit 340 may be an N-type transistor. In other words, the gate electrode of the N-type transistor is used as the first terminal of the capacitor while the source and the drain of the N-type transistor are coupled to serve as the second terminal.

In the present embodiment, the charging/discharging unit 340 further comprises a P-type transistor T9 whose gate electrode is coupled to the power source voltage so that the transistor T9 is at the cut-off status during a period of turning on the power source. After the power source is turned off, the transistor T9 will be turned on because charges are stored in the capacitor C3 during a period of turning on the power source and thus the source-drain voltage of the transistor T9 is larger than its threshold voltage. The capacitor C3 will be restored to its initial status by discharging through the transistor T9.

The output circuit 350 (for example, an inverter in this embodiment) receives the stored voltage 342 of the capacitor C3. At an initial moment of turning on the power source, since the stored voltage 342 doesn't reach a threshold voltage of the output circuit 350, the voltage of the output reset signal is a "high" level. During a period of charging the capacitor C3, when the stored voltage 342 reaches the threshold voltage of the output circuit 350, the voltage of the output reset signal is reversed to a "low" level. Accordingly, the reset signal with a sufficient time may be generated at the initial moment of turning on the power source.

The power-low reset circuit 360 comprises P-type transistors T1~T2, a control switch T3, a buffer 361 and a clamping circuit 362. In the present embodiment, the power-low reset circuit 360 is similar to the power-low reset circuit 220 so that its operation will be not described again. Moreover, the buffer 361, for example, may be implemented by connecting two inverters in series and the clamping circuit 362 may be implemented by connecting tree diodes in series.

Figure 4:
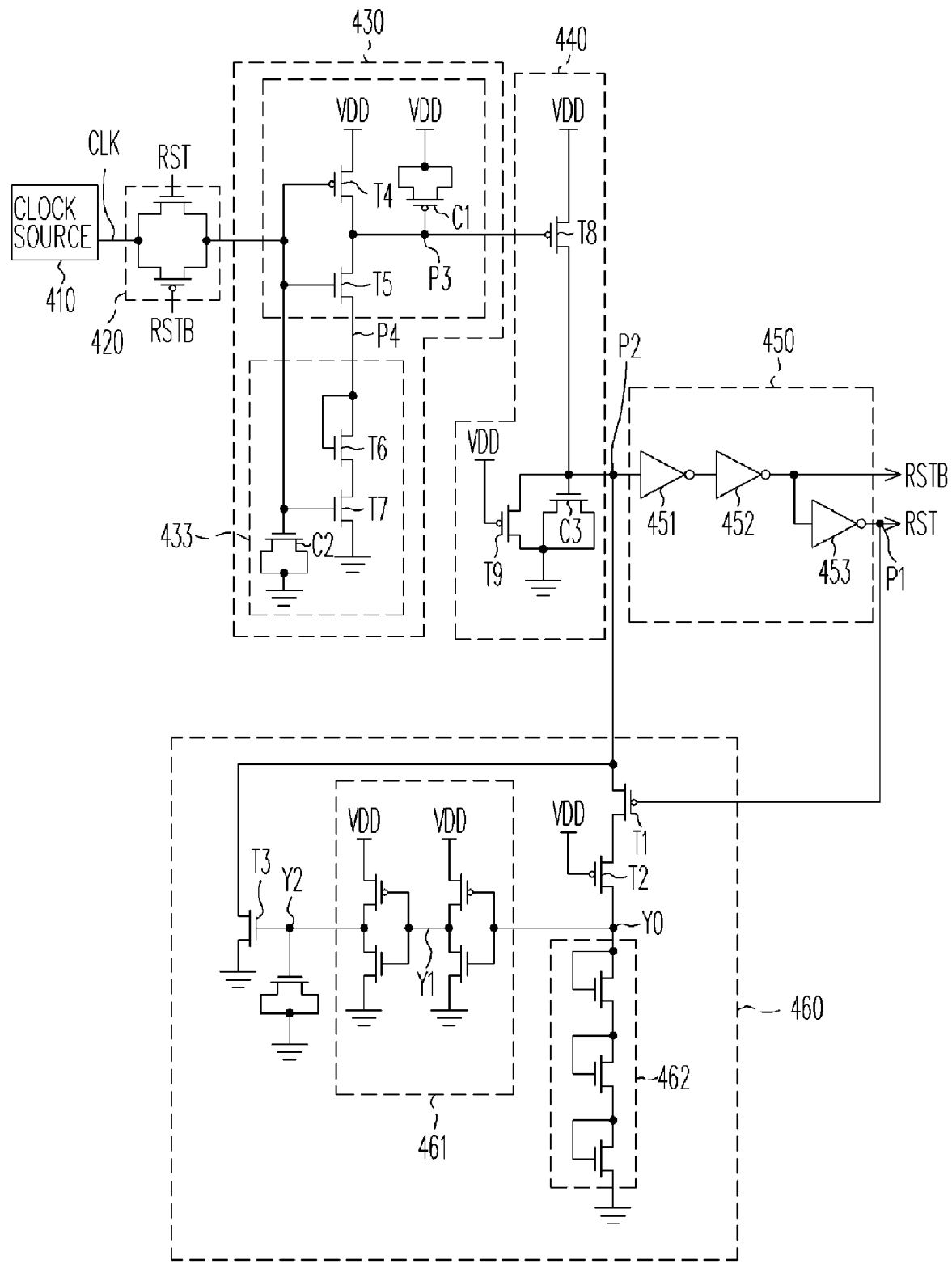
FIG. 4 shows another RST signal generating circuit according to an embodiment of the present invention.

FIG. 4 shows another RST signal generating circuit according to an embodiment of the present invention. The power-on reset circuit in FIG. 4 is similar to that in FIG. 3 so that the operation of the circuit will be not described again. Referring to FIG. 4, a clamping circuit 433 in an adjusting circuit 430 has a capacitor C2 coupled to the gate electrode of a transistor T7 (here employing an N-type transistor). Namely, one terminal of the capacitor C2 is coupled to the gate electrode of the transistor T7 while another terminal thereof is connected to ground.

The output circuit 450, for example, comprises inverters 451~453. The buffer composed of inverters 451~452 connected in series receives the stored voltage of the capacitor C3 (a voltage at the P2 point) and outputs an inverted reset voltage. The inverter 453 further receives the inverted reset voltage and outputs a reset voltage RST (i.e. a voltage at the P1 point).

In the present embodiment, a control switch may be a transmission gate, wherein two gate electrodes of the transmission gate receives the reset voltage RST and the inverted reset voltage, respectively, so that the clock signal CLK is transmitted to the adjusting circuit 430 at the initial moment of turning on the power source until the reset voltage RST is reversed. The transmission path of the clock signal CLK is cut off after the reset voltage RST is reversed.

A power-low reset circuit 460 is similar to the power-low reset circuit 360 in FIG. 3, wherein inverters in a buffer 461 is implemented by connecting a P-type transistor and an N-type transistor in series. The diodes in a clamping circuit 462 may be implemented by using N-type transistors, that is, the drain and the gate electrode of the N-type transistors are coupled as an anode of diodes while the source thereof is regarded as a cathode.

Figure 5:
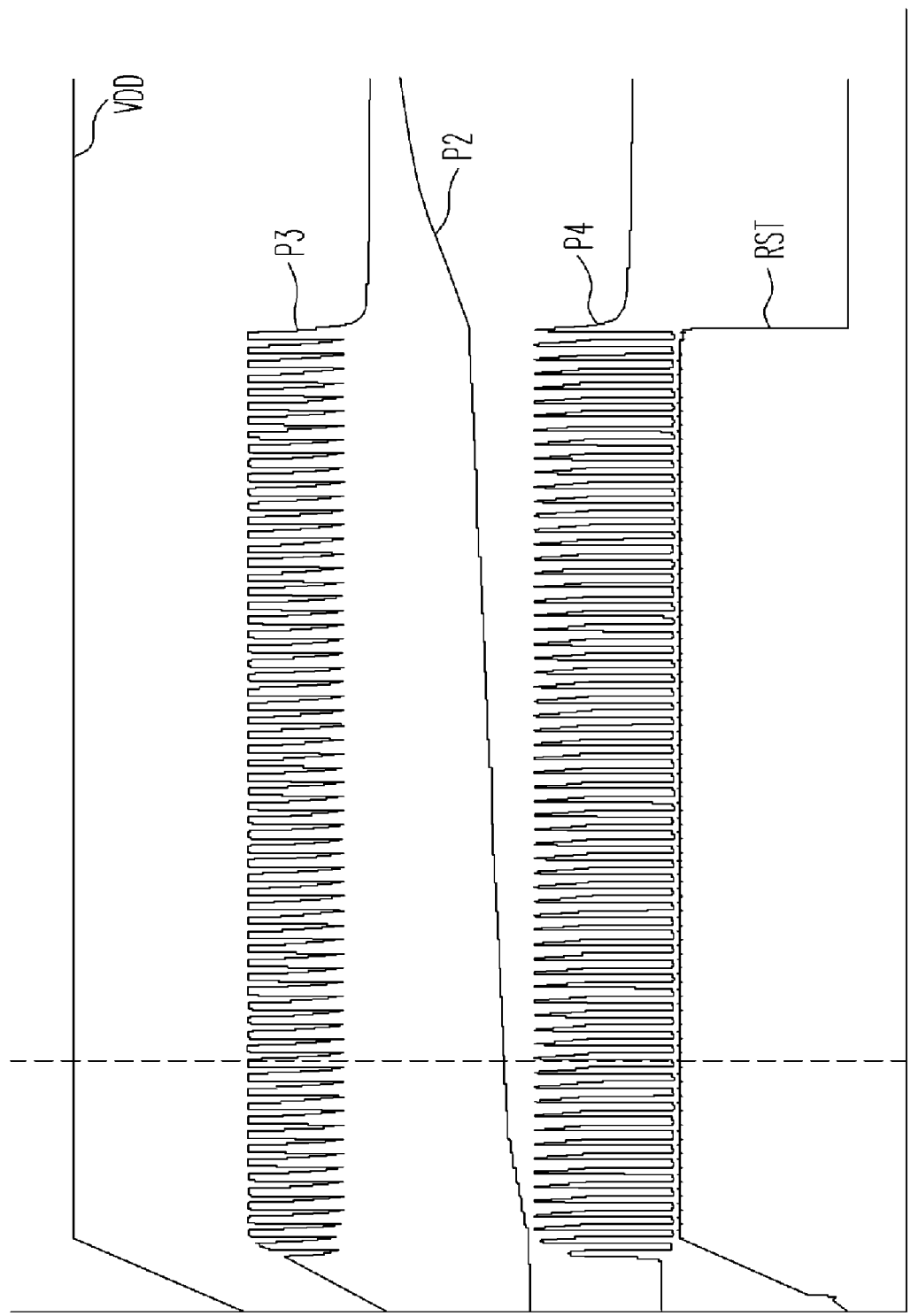
FIG. 5 is timing charts of simulation signals of a power-on reset circuit shown in FIG. 4.

FIG. 5 illustrates timing chart of simulation signals of a power-on reset circuit shown in FIG. 4. From top to bottom, the first curve in the drawing represents a timing of the power source voltage VDD, the second curve represents a timing of the signal at point P3 point (control signal), the third curve represents a timing of the signal at point P2 (stored voltage of the capacitor C3), the forth curve represents a timing of the signal at point P4 (a voltage at an output of the clamping circuit) and the fifth curve represents a timing of the reset signal RST in FIG. 4.

Figure 6:
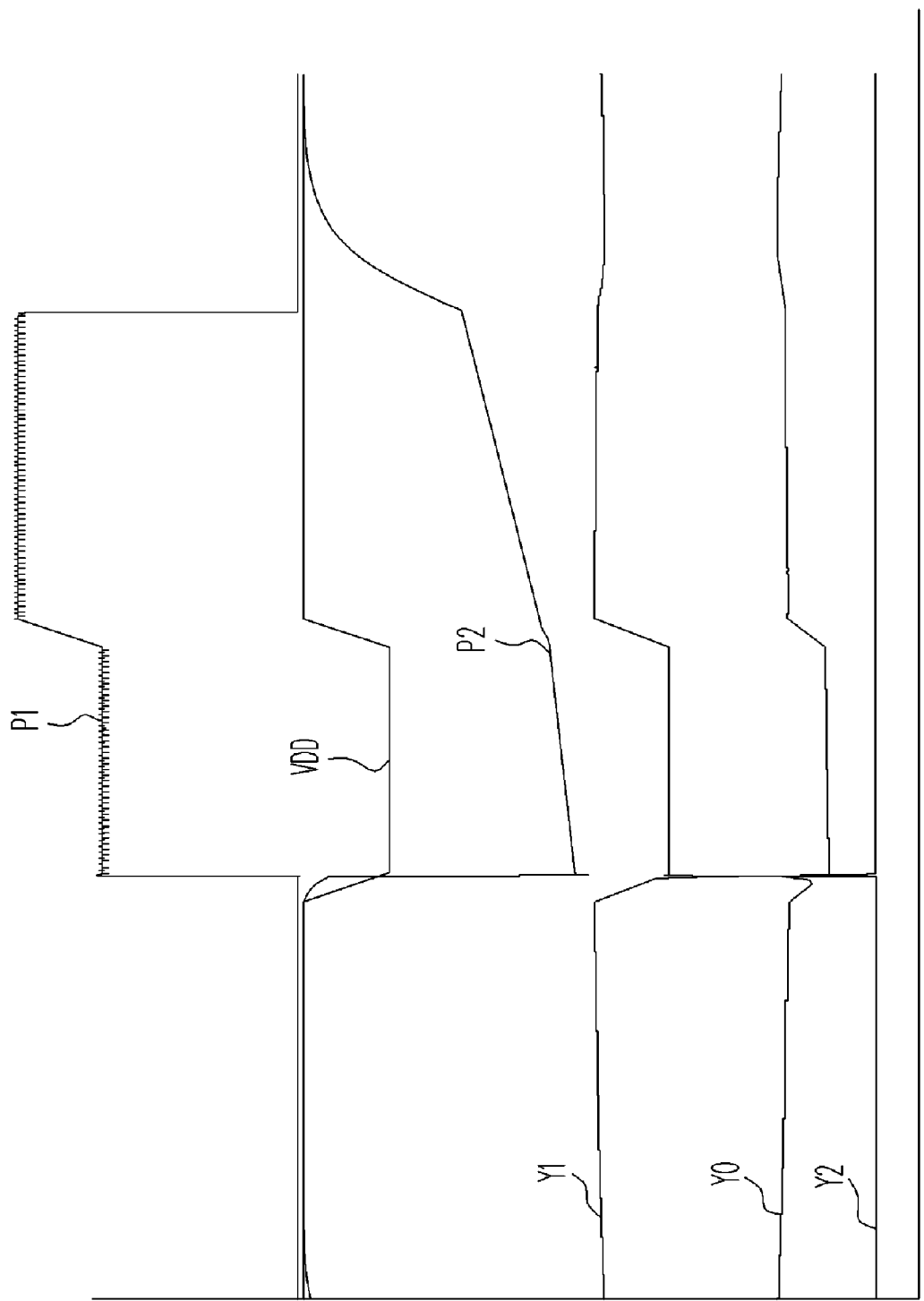
FIG. 6 is timing charts of simulation signals when a power-on reset circuit shown in FIG. 4 abruptly and temporally drops.

FIG. 6 is a timing chart of simulation signals when a power-on reset circuit shown in FIG. 4 abruptly and temporally drops. From top to bottom, the first curve in the drawing represents a timing the reset signal RST at point P1 in FIG. 4, the second curve represents a timing of the power source voltage from first temporally dropped and then restored to original voltage level, the third represents a timing of the signal at P2 point in FIG. 4 (stored voltage of the capacitor C3) and the forth to sixth curves represent timings of signals at points Y1, Y0 and Y2, respectively.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power-low reset circuit, receiving a reset signal outputted from a power-on reset circuit and a stored voltage of a capacitive device in the power-on reset circuit for providing an electrical path through the capacitive device in the power-on reset circuit to initiate charging/discharging for restoring to an initial status of the capacitive device when a power source voltage drops under a predetermined level, wherein the power-on reset circuit generates a reset signal at an initial moment of turning on the power source, the power-low reset circuit comprising:

a first transistor, comprising a first gate electrode a first source/drain and a second source/drain, wherein the first gate electrode is adopted to receive the reset signal and the first source/drain is adopted to receive the stored voltage;

a second transistor, comprising a second gate electrode, a third source/drain and a fourth source/drain, wherein the second gate electrode is adopted for receiving the power source voltage, wherein the third source/drain is coupled to the second source/drain of the first transistor, and wherein a second source/drain voltage is a control voltage;

a control switch, comprising a first connection terminal and a second connection terminal, wherein the first connection terminal is adopted for receiving the stored voltage and the second connection terminal is coupled to a fixed voltage, and wherein the control switch determines whether or not the first connection terminal and the second connection terminal are connected together in accordance with the control voltage; and a clamping circuit, comprising a first terminal coupled to the fourth source/drain of the second transistor and the second terminal is coupled to the fixed voltage.

2. The power-low reset circuit according to claim 1, wherein the first transistor and the second transistor are P-type transistors.

3. The power-low reset circuit according to claim 1, wherein the control switch is a transistor.

4. The power-low reset circuit according to claim 3, wherein the control switch is an N-type transistor.

5. The power-low reset circuit according to claim 1, wherein the clamping circuit is composed of at least one diode.

6. The power-low reset circuit according to claim 1, further comprising:

a buffer, coupled between the fourth source/drain of the second transistor and the control switch, for receiving the control voltage and outputting the control voltage to the control switch.

7. The power-low reset circuit according to claim 1, wherein the fixed voltage is a ground voltage.

* * * * *